(12) United States Patent
Takahashi et al.

(10) Patent No.: US 6,743,331 B2
(45) Date of Patent: Jun. 1, 2004

(54) COMPONENT BONDER AND BONDING TOOL

(75) Inventors: Seiji Takahashi, Fukuoka (JP); Masafumi Hizukuri, Saga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/347,271

(22) Filed: Jan. 21, 2003

(65) Prior Publication Data

US 2003/0136523 A1 Jul. 24, 2003

(30) Foreign Application Priority Data

Jan. 21, 2002 (JP) .......................... 2002-011364

(51) Int. Cl.[7] .............................................. B29C 65/08
(52) U.S. Cl. ................... 156/580.2; 156/580.1; 228/1.1
(58) Field of Search ................. 156/73.1, 580, 156/580.1, 580.2, 581; 425/174.2; 228/1.1, 4.1, 4.5, 6.2, 8, 49.1, 49.5, 110.1; 310/323.18, 328

(56) References Cited

U.S. PATENT DOCUMENTS

| 5,730,832 | A | * | 3/1998 | Sato et al. ................... 156/499 |
|---|---|---|---|---|
| 5,883,460 | A | * | 3/1999 | Sato et al. ................... 310/348 |
| 5,884,831 | A | * | 3/1999 | Sato et al. ................... 228/6.2 |
| 6,109,502 | A | * | 8/2000 | Sato ............................ 283/1.1 |
| 6,168,063 | B1 | * | 1/2001 | Sato et al. ................... 228/1.1 |
| 6,247,628 | B1 | | 6/2001 | Sato et al. ................... 228/1.1 |
| 6,497,354 | B2 | * | 12/2002 | Takahashi et al. ........... 228/1.1 |

FOREIGN PATENT DOCUMENTS

JP    11-265914    9/1999

* cited by examiner

*Primary Examiner*—James Sells
(74) *Attorney, Agent, or Firm*—Wenderoth, Lind & Ponack, L.L.P.

(57) ABSTRACT

A bonding tool for bonding electronic components by ultrasonic vibration. The bonding tool includes a horn supported by two ribs from both sides, and a transducer is attached to an end of this horn. A protrusion protruding downward from the center between the ribs is provided on the horn, and a tip of the protrusion is a bonding portion which contacts the electronic component. The transducer is driven to apply vertical vibration to the horn. A phase of vertical expansion and compression vibration on the horn generated by this vertical vibration is set to have the same phase as that of bending vibration on the protrusion. Accordingly, displacement by expansion and vertical vibration at side ends of the bonding portion is canceled out by displacement caused by bending vibration.

4 Claims, 6 Drawing Sheets

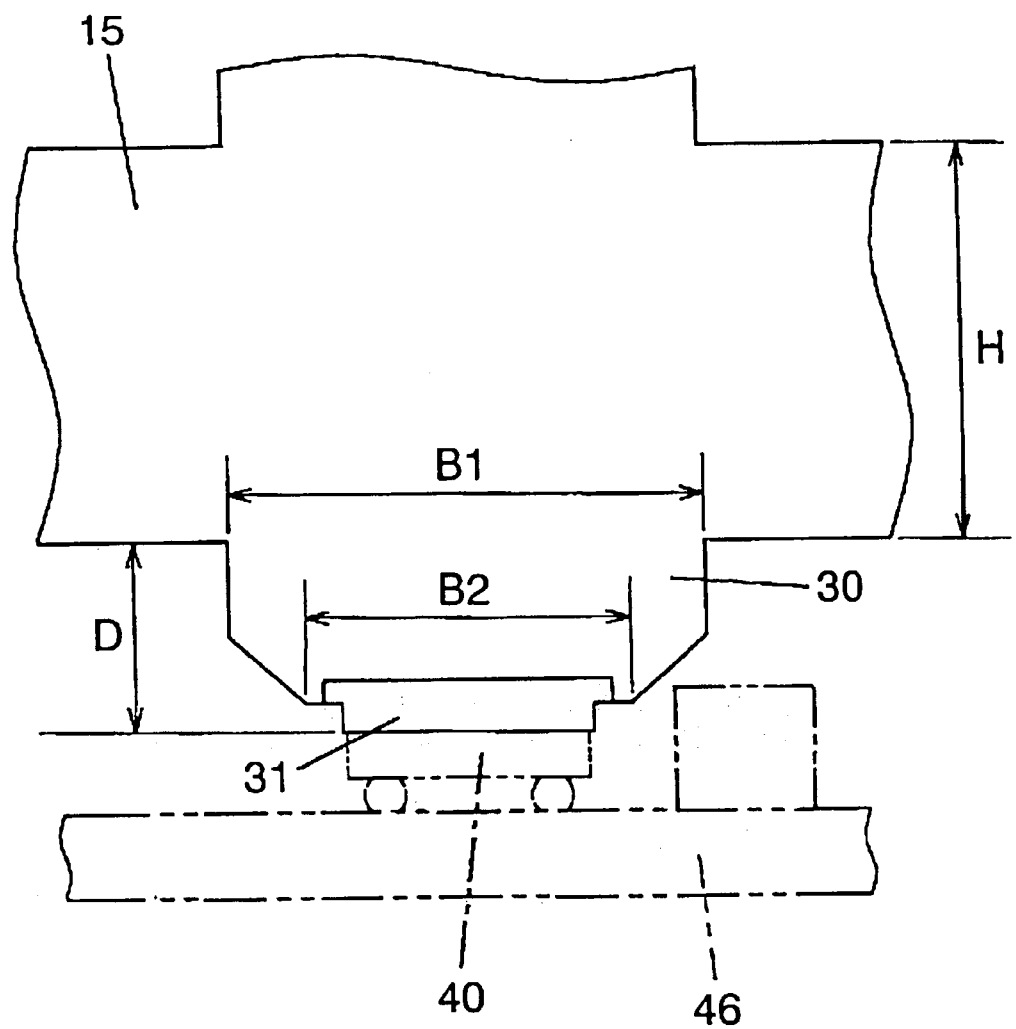

COMPONENT BONDER AND BONDING TOOL

FIELD OF THE INVENTION

The present invention relates to bonders for bonding electronic components such as those with bumps onto target surfaces such as electrodes on a substrate and bonding tools for electronic components.

BACKGROUND OF THE INVENTION

Ultrasonic press bonding is one of several known methods for bonding electronic components onto target surfaces such as electrodes on a substrate. In this method, ultrasonic vibration is applied to an electronic component while it is pressed against the target surface. Friction generated by minute vibrations of contacting faces results in intimate contact of the contacting faces. A bonding tool used in this method has a horn which is a long thin bar for conveying the vibration of an ultrasonic transducer, the vibration-generating source, to the electronic component. A contacting point of this horn applies load and vibration to the electronic component so as to press and bond the electronic component onto the target surface.

This bonding portion is generally provided at a tip of an element protruding from the horn, in order to avoid interfering with other electronic components, at a part corresponding to the peak where the amplitude is the largest in the horn. Bending vibration, generated by vibration (vertical vibration) conveyed to this protrusion through the horn, amplifies the vibration on a face contacting the electronic component, resulting in bonding of the electronic component.

When the above bonding tool is used for bonding large electronic components, the following disadvantages occur. Displacement perpendicular to the contacting face (in the vertical direction), as well as displacement parallel to the contacting face (horizontal direction), occurs in bending vibration of the protrusion as described above. This displacement increases as the area contacting the electronic component expands. Accordingly, the vertical displacement exceeds a negligible level in the bonding tool for large electronic components.

The vertical load repeatedly applied to the electronic component, as well as the horizontal displacement, risks causing damage to the electronic component. Use of the conventional bonding tool may result in damage to a component during bonding when trying to use the vibration efficiently.

SUMMARY OF THE INVENTION

The present invention offers a bonder for press welding an electronic component onto a target face by applying load and vibration to the electronic component. The bonder includes a bonding tool and pressing means to press the electronic component onto the bonding tool. The bonding tool includes a lateral horn supported by a fixed part from both sides; a transducer which applies vertical vibration in a first direction which is a length direction of the horn; a protrusion provided at approximately the center of the fixed part so as to protrude in a second direction approximately perpendicular to the first direction; and a bonding portion provided at the tip of the protrusion which contacts the electronic component. In the bonder of the present invention, the phase of the expansion and compression vibration waveform in the second direction of the horn, which is generated by the vertical vibration, is the same as the phase of a bending vibration waveform at the protrusion generated by the vertical vibration.

BRIEF DESCRIPTION OF THE DRAWINGS

FIG. 4 is a magnified front view of a protrusion on the bonding tool for electronic components in accordance with the embodiment of the present invention.

DETAILED DESCRIPTION OF THE INVENTION

An embodiment of the present invention is described below with reference to the drawings.

Figure 1:
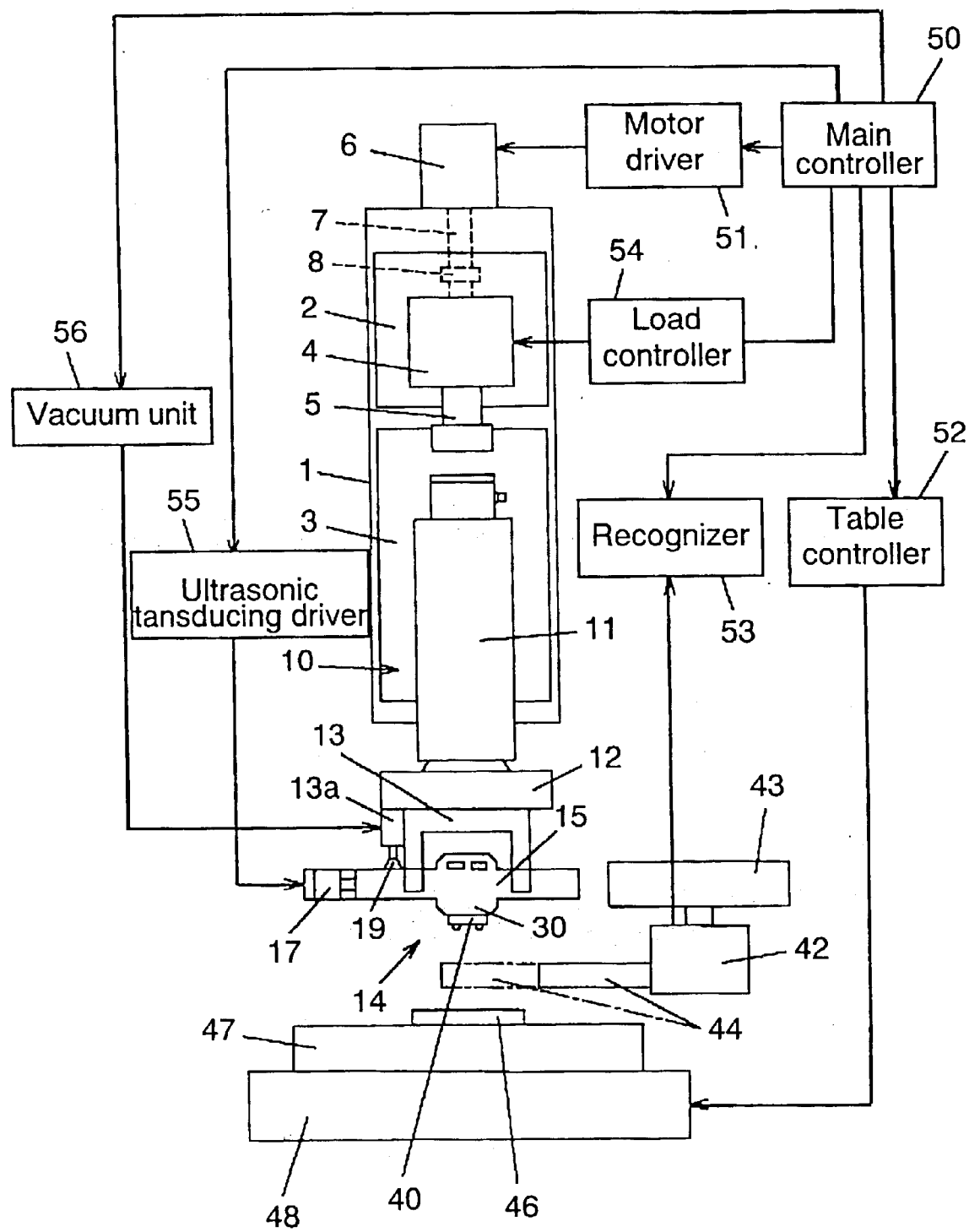
FIG. 1 is a front view of an electronic component bonder in accordance with an embodiment of the present invention.
Figure 2A:
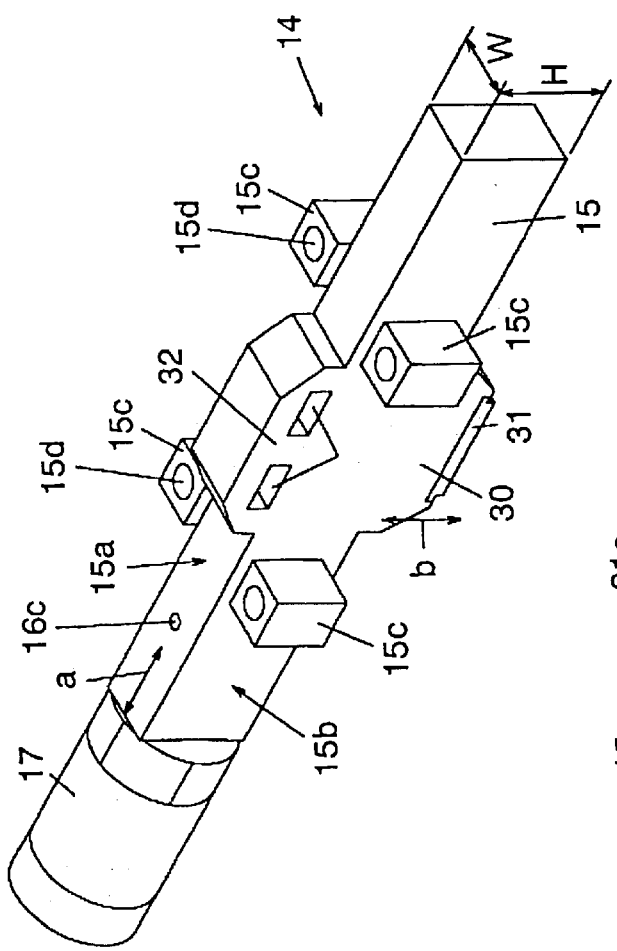
FIG. 2A is a perspective of an electronic component bonding tool in accordance with the embodiment of the present invention.
Figure 2B:
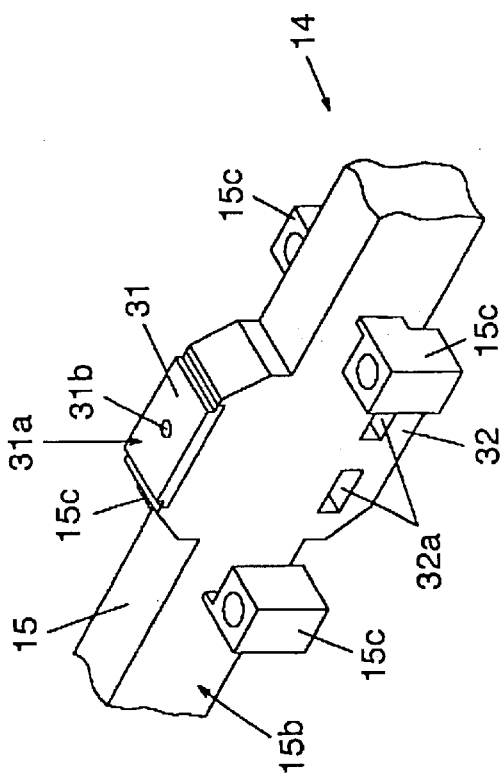
FIG. 2B is a vertically reversed perspective of the electronic component bonding tool in accordance with the embodiment of the present invention.
Figure 3:
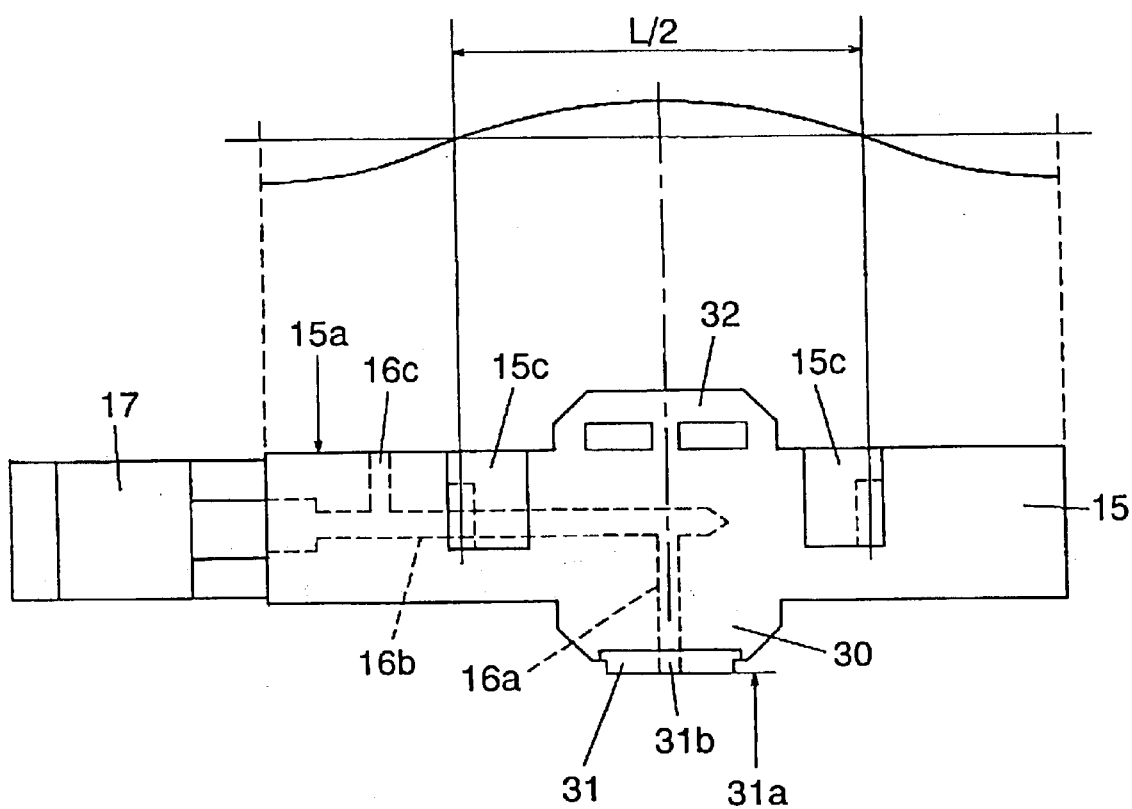
FIG. 3 is a front view of the electronic component bonding tool in accordance with the embodiment of the present invention.

FIG. 1 is a front view of a bonder for electronic components in the embodiment of the present invention. FIG. 2A is a perspective of an electronic component bonding tool, FIG. 2B is a vertically reversed perspective of the electronic component bonding tool, and FIG. 3 is a front view of the electronic component bonding tool. FIG. 4 is a magnified front view of a protrusion on the electronic component bonding tool, FIGS. 5A, 5B, 5C, and 5D illustrate deformation of the electronic component while vibration is applied by the bonding tool, and FIG. 6 shows vibration measurements of the electronic component bonding tool in the embodiment.

First, an overall structure of the bonder for electronic components is described with reference to FIG. 1. A support frame 1 carries a first elevating plate 2 and a second elevating plate 3 on its front face. First elevating plate 2 is attached to a cylinder 4, and a rod 5 is connected to second elevating plate 3. A bonding head 10 is attached to second elevating plate 3. A z-axis motor 6 is provided on the front face of support frame 1. Z-axis motor 6 rotates a vertical feeding screw 7. Feeding screw 7 is spirally fitted to a nut 8 provided on the rear face of first elevating plate 2. Consequently, nut 8 moves vertically along feeding screw 7, and first elevating plate 2 and second elevating plate 3 also move vertically.

In FIG. 1, a substrate 46, whose top face is the face contacting the electronic component, is placed on a substrate holder 47. Substrate holder 47 is placed on a table 48. Table 48 is a movable table, which horizontally moves substrate 46 in the X and Y directions to position substrate 46 in a predetermined position. Table 48 is thus the positioning means for moving substrate 46 relative to electronic component 40.

A camera 42 is attached to a single-shaft table 43. A lens-barrel 44 extends to the front from camera 42. Camera 42 is moved forward along one-shaft table 43, and the tip of lens-barrel 44 is positioned between substrate 46 and electronic component 40, which has a bump and is vacuum-held on the bottom face of a bonding tool 14, as shown by chain lines in FIG. 1. In this state, camera 42 monitors positions of electronic component 40 and substrate 46.

A recognizer 53 recognizes the image of electronic component 40 or substrate 46 captured by camera 42, and detects their positions. A main controller 50 controls z-axis motor 6, i.e., elevation of bonding head 10, through a motor driver 51, and positions table 48, i.e., substrate 46, through a table controller 52. Main controller 50 also calculates dislocation of electronic component 40 and substrate 46 in a horizontal plane based on their positions detected by recognizer 53, and then drives table 48 to correct the dislocation if any. In addition, a load controller 54 and a vacuum unit 56 are connected to main controller 50.

Cylinder 4 is connected through load controller 54 to main controller 50 to serve as a pressing means. Cylinder 4 controls a protruding force of rod 5 of cylinder 4 which is a pressing load to press the bumps of electronic component 40 against substrate 46 using bonding tool 14. Vacuum unit 56 vacuum-holds and releases electronic component 40 with bonding tool 14 based on commands from main controller 50. A transducer 17 is connected to main controller 50 through an ultrasonic transducing driver 55. Ultrasonic vibration is applied to bonding tool 14 when transducer 17 is driven by ultrasonic transducing driver 55 in accordance with commands from main controller 50. Here, the vibration of bonding tool 14 is resonant, and thus the phase difference of the voltage and current applied to transducer 17 is close to zero.

A holder 12 is connected at the bottom of a main body 11 of bonding head 10. A block 13 is attached to holder 12, and bonding tool 14 is fixed to block 13. A protrusion 13a at the side of block 13 is connected to vacuum unit 56. A vacuum pad 19 is provided on protrusion 13a, and vacuum pad 19 contacts horn 15, as described later, so that vacuum unit 56 can vacuum-hold electronic component 40.

Next, bonding tool 14 is described with reference to FIGS. 2A, 2B, and 3. FIG. 2A is a perspective of bonding tool 14 detached from block 13, seen diagonally from the top. FIG. 2B shows a part of horn 15 when bonding tool 14 is reversed vertically. FIG. 3 is a front view of bonding tool 14 and a graph illustrating the amplitude of standing wave vibration induced by horn 15.

As shown in FIG. 2A, bonding tool 14 mainly consists of lateral horn 15. Horn 15 is made of, for example, metal (such as stainless steel, aluminum, or titanium), and is a bar having height H, width W and a rectangular cross section. Transducer 17 is attached to one end of horn 15. Dimensions H and W can be changed continuously or step-by-step lengthwise along the horn. This enables horn 15 to adjust the level of vibration applied to horn 15 by the vibration applying means. Vertical vibration is applied in the first direction (the direction of arrow a) lengthwise along horn 15 by driving transducer 17. Accordingly, transducer 17 is the vibration applying means for applying vibration in the first direction lengthwise along horn 15.

Ribs 15c are integrally provided at two points on each of side faces 15b of horn 15, so as to be disposed equidistantly from the center. The distance (along the first direction a) between two ribs 15c is set equivalent to a half wavelength (L/2) of the vertical vibration applied by transducer 17 in order to minimize attenuation of vibration caused by fixing a vibrating component (FIG. 3). However, this distance is not necessarily required to be L/2 as long as attenuation of vibration falls within an acceptable range.

Ribs 15c protrude outward from horn 15, and horn 15 is fixed onto block 13 so as to be supported from both sides by inserting a bolts (not illustrated) into attachment holes 15d formed in ribs 15c and then tightening the bolts to block 13. In other words, the four (two pairs of) ribs 15c form a fixing part for securing horn 5 onto block 13.

Since this horn 5 is anchored with four ribs 15c, which are symmetrically positioned with respect to the center of horn 15, bonding tool 14 can be fixed onto block 13 in a well-balanced fashion. In addition, load applied to horn 15 by the pressing means can be supported in a well-balanced fashion. The number of ribs 15c is not limited to four. For example, two ribs can be disposed on the upper part of the knot of horn 15. The purpose of the ribs is to support the load applied to horn 15 in a well-balanced fashion. As long as this purpose is achieved, the number of ribs may vary. The bonding tool has a structure such that the bolts inserted into attachment holes 15d, once tightened, do not protrude from the bottom face of horn 15. This enables the anchoring of bonding tool 14 without causing interference with electronic components on the substrate during bonding.

A protrusion 30 is formed at the approximate center of the two pairs of (four) ribs 15c in a second direction (the direction of arrow b) perpendicular to the first direction. Protrusion 30 is made with the same material as horn 15, and preferably made integral with horn 15. However, protrusion 30 made of a material different from that of horn 15 is also feasible. If using a different material, the shape and dimensions of protrusion 30 are determined taking into consideration the difference in density, Young's modulus, and Poisson's ratio thereof with respect to those of horn 15.

A bonding portion 31, which contacts electronic component 40 to be bonded, is provided at the tip of protrusion 30. A bump of electronic component 40 is pressed onto substrate 46 by applying a pressing load to bonding tool 14 while bonding portion 31 contacts electronic component 40. Electronic component 40 is then press-bonded onto substrate 46 by load and vibration generated by applying vertical vibration to horn 15 using driving transducer 17. Since protrusion 30 is placed at the center of the four ribs 15c, uniform pressure can be applied even to large components which require a high pressing load.

As shown in FIG. 2B, a vacuum hole 31b is formed in the bottom face of bonding portion 31. This vacuum hole 31b is linked to suction hole 16c (FIG. 2A) that opens through a top face 15a of horn 15 through suction lines 16a and 16b formed inside horn 15 as shown in FIG. 3.

When bonding tool 14 is secured onto block 13, vacuum hole 31b is linked to vacuum pad 19 through suction lines 16a, 16b, and suction hole 16c, when vacuum pad 19 provided on protrusion 13a contacts top face 15a of horn 15 (FIG. 1). Accordingly, when vacuum unit 56 (FIG. 1) connected to vacuum pad 19 is driven, air is vacuumed through vacuum hole 31b to make bonding face 31 a vacuum-hold electronic component 40. In other words, protrusion 30 acts as a vacuuming element for vacuum-holding electronic component 40 by contacting the top face of electronic component 40 as well as pressing electronic component 40 onto substrate 46.

A vibration balancer 32, which is a protrusion of almost the same shape as protrusion 30, is provided at the opposite side of protrusion 30 in the length direction of horn 15. Vibration balancer 32 is preferably made of the same material as horn 15 so that balancer 32 and horn 15 can be made integrally. However, balancer 32 can also be made of a different material. If using a different material, the shape and dimensions of vibration balancer 32 are determined taking into consideration the difference in density, Young's modulus, and Poisson's ratio thereof with respect to those of horn 15. Vibration balancer 32 is provided mainly to maintain vertical vibration balance of horn 15 by securing the weight balance. A balancing level is adjustable in accordance with the position, shape, and size of through holes 32a provided they pass through horn 15 in the thickness direction. This vibration balancer 32 makes vibration and weight distributions of horn 15 almost symmetrical with respect to the center axis, assuring uniform transmission of vibration.

Next, vibration characteristics of horn 15 are described. Standing wave vibration as shown in the graph in FIG. 3 is generated in horn 15 by driving transducer 17 with a frequency appropriate for horn 15 (any frequency that resonates horn 15 is acceptable, but preferably between 40 kHz and 70 kHz, and more preferably around 60 kHz for bonding electronic components) to apply vertical vibration in the first direction to the horn for resonance, using ultrasonic transducing driver 55.

In other words, with respect to the standing wave vibration of horn 15, the positions of ribs 15c remain virtually constant in the horizontal direction, and thus the position of protrusion 30 disposed at the center of ribs 15c is equivalent to the peak where the horizontal amplitude is at a maximum. The position of protrusion 30 is preferably set to be at the peak position of this standing wave vibration. However, as long as protrusion 30 is approximately at the center of ribs 15c which anchor horn 15, its position can be slightly different from the peak position of the standing wave vibration.

Vibration of protrusion 30 is then transmitted to electronic component 40 through bonding face 31a. When vibration is transmitted to electronic component 40, bending vibration induced to protrusion 30 as a result of the vertical vibration of horn 15, described later, is superposed on the vertical vibration applied to horn 15 by transducer 17, and both are transmitted to electronic component 40.

Next, the minute shape of protrusion 30 is described with reference to FIG. 4. As shown in FIG. 4, protrusion 30 of predetermined protruding height D and base width B1 is created on the bottom face of horn 15. Protrusion 30 has a tapered shape in which tip width B2 where bonding portion 31 is provided is smaller than base width B1. Tip width B2 is determined in accordance with the size of electronic component 40 to be bonded.

The tapered shape of protrusion 30 avoids interference between protrusion 30 and components already mounted on substrate 46 while bonding. In addition, since only bonding portion 31 and tip width B2 are processed in accordance with target electronic components, bonding tool 14 which has a basic shape and dimensions can be commonly used for different types of electronic components.

Protruding height D, base width B1, and tip width B2 are determined in combination with height H and width W of horn 15 as described later. In this embodiment, base width B1 is set to be smaller than half the wavelength (L/2) because the base of protrusion 30 is disposed between two pairs of (four) ribs 15c. Dimensions are also selected in relation with height H of horn 15 near protrusion 30: base width B1 is set to be greater than height H and height H is set to be greater than protruding height D.

Bonding portion 31 provided at the tip of protrusion 30 is a sheet member manufactured in accordance with the size of the electronic component to be bonded; and this sheet member is bonded, attached, and fixed onto protrusion 30 by brazing, bolting, etc. If the sheet member is brazed, the sheet member can be firmly and reliably anchored. On the other hand, bolting enables interchangeability. A sheet member made of a rigid material (such as a sintered hard alloy) demonstrates good abrasion resistance and extends service life of bonding tool 14. It is naturally acceptable to integrally manufacture bonding portion 31, which contacts electronic component 40, and protrusion 30.

Moreover, bonding portion 31 can be detachably provided on protrusion 30, or protrusion 30 can be detachably provided on horn 15. This enables the replacement of only worn parts, further extending the service life of bonding tool 14.

Figure 5A:
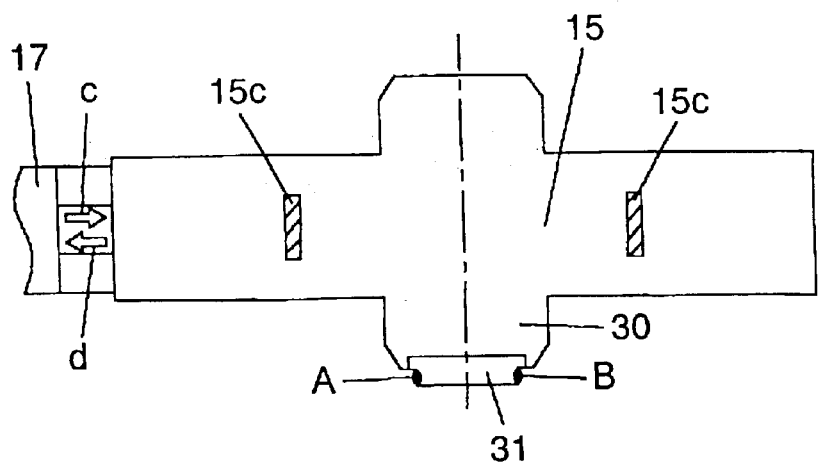
FIGS. 5A, 5B, 5C, and 5D illustrate how the electronic component bonding tool deforms when vibration is applied in accordance with the embodiment of the present invention.

Next to be described with reference to FIGS. 5A, 5B, 5C, and 5D, is how bonding tool 14 where protrusion 30 with aforementioned shape and dimensions deforms when vibration is applied. As shown in FIG. 5A, two pairs of (four) ribs 15c support horn 15 from both sides, and transducer 17 mounted to the left of horn 15 is driven while horn 15 is anchored in these two positions. This transmits vertical vibration to horn 15, in which displacement in opposite directions, shown by arrows c and d, reciprocate.

With respect to the outline of horn 15, the entire horn 15 moves slightly rightward along the first direction when transducer 17 applies rightward displacement shown by arrow c while horn 15 vibrates horizontally. With respect to the inside of horn 15, the right and left parts deform differently. More specifically, the left half of horn 15 deforms so as to be compressed from both sides toward ribs 15c because horn 15 is fixed at the position of ribs 15c.

The right half where its tip is free deforms so as to pull the position of ribs 15c from both sides. Here, center 15e of horn 15 displaces to the left, and thus bonding portion 31 horizontally displaces to the left.

In the second direction perpendicular to the first direction, horn 1 expands and compresses in response to the Poisson's ratio peculiar to horn 15 by expansion and compression displacement along the first direction of horn 15. The expansion and compression displacement along the second direction is almost zero at the center of horn 15, and reaches a maximum at the positions of ribs 15c where horn 15 is fixed. This generates expansion and compression displacement ΔH (a) and ΔH (b) which always act in opposite directions at positions corresponding to both side ends along the first direction of bonding portion 31 (Points A and B in FIG. 5A).

Since the direction of vibrating displacement given to horn 15 from transducer 17 reverses, expansion and compression displacement ΔH (a) and ΔH (b) also reverse. In other words, expansion vibration occurs along the second direction of horn 15 by vertical vibration applied to horn 15 by transducer 17. If horn 15 is symmetrical, the absolute values of expansion and compression displacement ΔH(a) and ΔH(b) are almost equivalent.

Figure 5B:
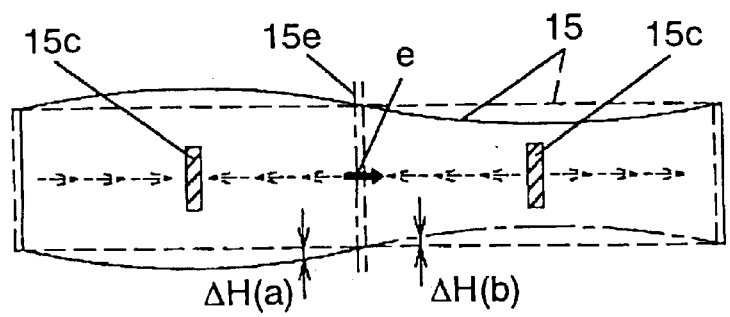
Figure 5C:
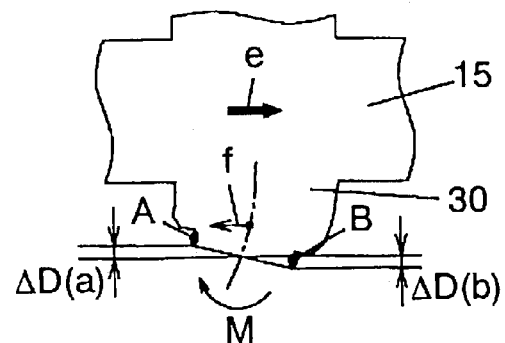
Figure 6:
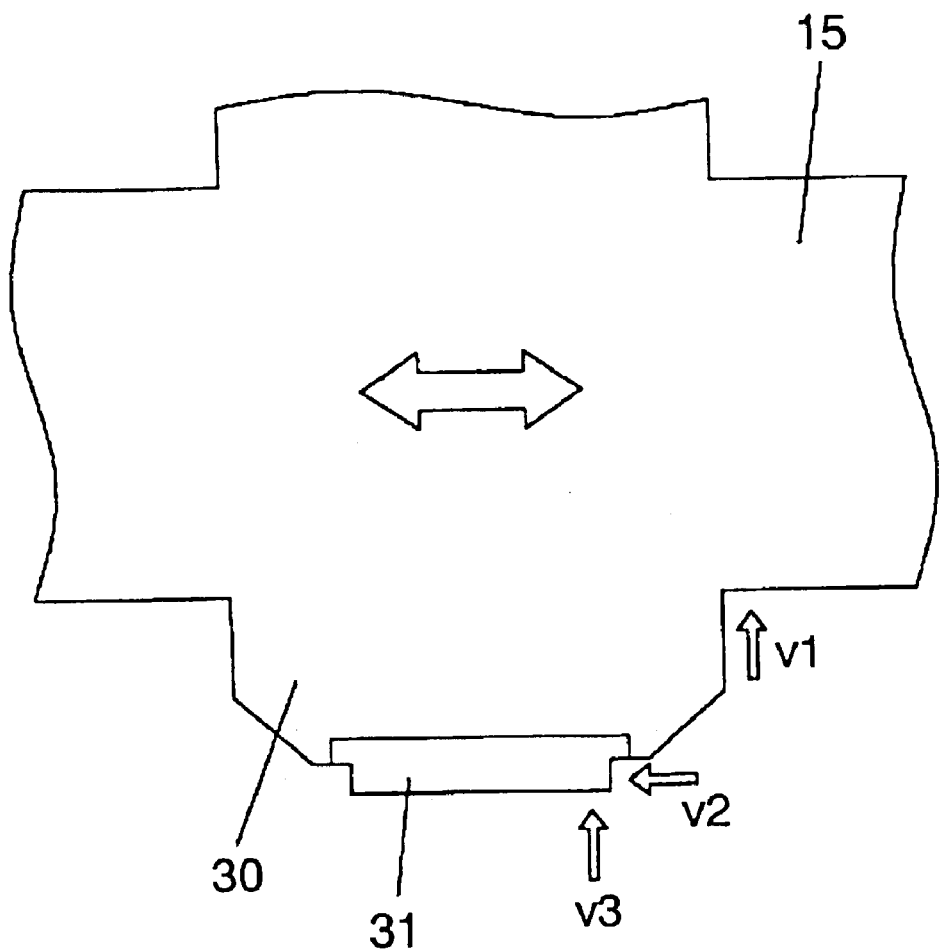
FIG. 6 illustrate vibration measurements of the electronic component bonding tool in accordance with the embodiment of the present invention.

FIG. 5C shows displacement caused by bending vibration induced to protrusion 30 by vertical vibration. The timing shown in FIG. 5B illustrates the state in which center 15e of horn 15 is displaced to the left by vertical vibration, as described above. Here, acceleration (arrow e) in the direction that pulls back this displacement in the opposite direction (rightward) is applied to center 15e. This rightward acceleration causes an inertial force (arrow f) opposing the acceleration of horn 15 and recovery force to the opposite direction (rightward) between protrusion 30 and horn 15. The recovery force is generated by deformation of protrusion 30.

These inertial and recovery forces apply a bending moment M to protrusion 30, and the bottom face of protrusion 30 bends as shown in FIG. 5C. The alternating acceleration due to vertical vibration of horn 15 applies inertial force and recovery force with the same vibration frequency as the vertical vibration to protrusion 30, generating a vibromotive force that causes the forced vibration of protrusion 30.

In other words, vertical vibration applied to horn 15 by transducer 17 applies the above vibromotive force to protrusion 30. This vibromotive force vibrates protrusion 30 with the vibration characteristics of a cantilever whose one end is fixed to horn 15 and the other end is free bonding portion 31. The free end of protrusion 30 vibrates by bending vibration caused by vibration delivered from horn 15. Accordingly, vibration with displacement along the second direction, perpendicular to the first direction, as well as displacement along the first direction which is the length direction of horn 15, is applied to bonding portion 31 of protrusion 30, causing vertical displacement $\Delta D(a)$ and $\Delta D(b)$ at aforementioned side ends A and B.

The shape and dimensions of protrusion 30 are set in a way that protruding height D becomes smaller than base width B1, as shown in FIG. 4. This makes the natural frequency of bending vibration of protrusion 30 extremely high. Accordingly, bending vibration (forced vibration) generated on protrusion 30 as a result of the vibromotive force applied by transducer 17 synchronizes with vertical vibration of transducer 17.

Figure 5D:
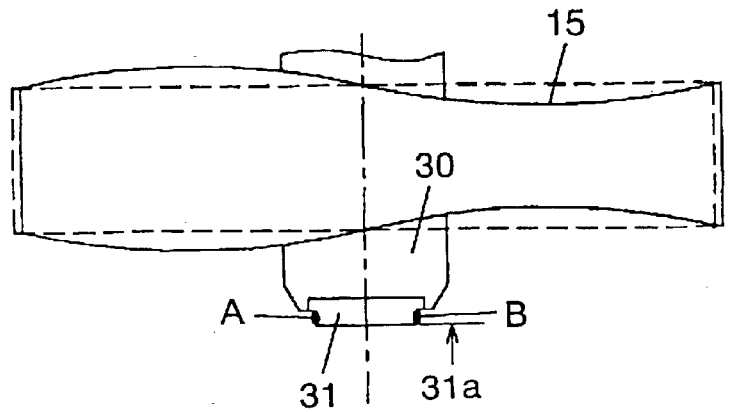

The phase of expansion and compression vibration waveform along the second direction generated by vertical vibration of horn 15 can be always made the same phase as the waveform of bending vibration generated on protrusion 30 by this vertical vibration (comparing these phases when arrows v1 and v2 in FIG. 6 are regarded as positive directions). More specifically, the deformations shown respectively in FIGS. 5B and 5C always occur synchronically. Accordingly, when transducer 17 applies a constant vibration to horn 15, bonding portion 31 deforms in the combination of FIGS. 5B and 5C, as shown in FIG. 5D.

Since expansion and compression displacement $\Delta H(a)$ and $\Delta H(b)$ and vertical vibration displacement $\Delta D(a)$ and $\Delta D(b)$ of protrusion 30 are always generated in mutually offsetting directions at side ends A and B of bonding portion 31, vertical displacement (second direction) of bonding face 31a is significantly reduced during bonding.

The vertical displacement does not contribute to ultrasonic bonding, and may in fact damage the electronic component by applying a vertical load. Accordingly, displacement at side ends A and B due to vertical expansion and compression vibration of horn 15 generated by vertical vibration, as described above, is offset by vertical displacement at side ends A and B by bending vibration on protrusion 30 generated by this vertical vibration, minimizing vertical displacement. Damage to electronic components during bonding is thus preventable and vibration of transducer 17 can be effectively applied.

When the shape and dimensions of each part of bonding tool 14 are determined, levels of aforementioned expansion displacement $\Delta H(a)$ and $\Delta H(b)$ of horn 15 and displacement $\Delta D(a)$ and $\Delta D(b)$ of protrusion 30 by bending vibration are preferably evaluated quantitatively for detailed setting. This makes it possible to achieve more efficiently the aim of reducing vertical displacement at bonding face 31a.

Expansion and compression displacement caused by vertical displacement given by transducer 17 is determined based on the area (Height H×Width W) of the section face perpendicular to the first direction of horn 15 when the vibration strength is constant. Displacement by bending of protrusion 30 depends on bending moment M (determined by inertial force applied to protrusion 30 and a position where a resultant inertial force is applied) and dynamic rigidity of protrusion 30. These are determined by the shape, dimensions and material of protrusion 30.

In other words, a phase of expansion and compression vibration waveform in the second direction generated by vertical vibration of horn 15 can be always made the same as the phase of the bending vibration waveform generated on protrusion 30 caused by this vertical vibration by appropriately setting the following combination: i) Height H and width W, which indicate the shape and dimension of horn 15 on a cross-section perpendicular to the first direction; and ii) base width B1, tip width B2, and protruding height D which indicate the shape and dimensions of protrusion 30. In addition, the absolute value of expansion and compression displacement $\Delta H(a)$ and $\Delta H(b)$ at the positions corresponding topside ends A and B caused by expansion and compression vibration and the absolute value of bending vibration displacement $\Delta D(a)$ and $\Delta D(b)$ at side ends A and B caused by bending vibration can be made approximately equivalent at corresponding positions. Displacement in the opposite directions thus enables the almost complete cancellation of vertical displacement when displacement by expansion vibration offsets displacement by bending vibration, achieving a more effective offset result.

For determining correlation among shapes and dimensions of each of the above-mentioned parts, $\Delta H(a)$, $\Delta H(b)$, $\Delta D(a)$, and $\Delta D(b)$, numerical methods for analysis such as the finite element method and methods referring to actual displacement measurements of the actual bonding tool are preferably combined. Fine-tuning of shape and dimensions enables the achievement of ideal horizontal vibration with almost no vertical displacement on bonding face 31a.

Next, actual vibration measurements of bonding tool 14 whose shape and dimensions are set as described above are described with reference to FIG. 6. As shown in FIG. 6, vertical vibration (v1) near the base of protrusion 30 on the bottom face of horn 15, and horizontal vibration (v2) and vertical vibration (v3) on side ends of bonding portion 31 are measured while applying vertical vibration to horn 15.

For measuring vibration, a laser vibration galvanometer is used, and the laser is applied to the above three measuring points to obtain a vibration waveform. Measurements are compared with a reference waveform (in this case, applied voltage of transducer 17, which applies vibration to horn 15) in order to compare vibration waveform phases at the measuring points. As a result, waveforms of vibrations v1 and v2 have the same phase. More specifically, they have the same phase when the phases of vibration waveform in the same single dimension (i.e., phases of vibration speed waveforms or phases of vibration displacement waveforms) are compared, provided that vibrations in the v1 direction and v2 direction are, considered the positive directions. Comparison of waveforms of vibrations v2 and v3 reveal that the amplitude of v3 is 10% or less of the amplitude of v2. This proves that there is a significant reduction in vertical displacement of bonding portion 31.

Accordingly, the expansion and compression displacement along the second direction at the side ends of the bonding portion of the horn caused by vertical vibration applied to the horn by the transducer is cancelled out by the displacement along the second direction by bending vibration on the protrusion caused by this vertical vibration. The present invention thus suppresses vertical displacement at the bonding portion which contacts the electronic component as much as possible, allowing efficient application of vibration without damaging electronic components.

What is claimed is:

1. A component bonder for press-bonding a component onto a contacting surface by applying load and vibration to the component, said bonder comprising a bonding tool and a pressing mechanism for pressing said bonding tool onto the component, said bonding tool comprising:

a lateral horn supported by a fixing part;

a transducer arranged to apply vibration to said horn in a first direction which is a length direction of said horn;

a protrusion protruding from said horn in a second direction approximately perpendicular to said first direction; and a bonding portion provided on a tip of said protrusion and arranged to contact the component, wherein a phase of expansion and compression vibration waveform of said horn in the second direction, which is generated by said vibration, is set to the same phase as that of bending vibration waveform at said protrusion generated by said vibration.

2. A component bonder for press-bonding a component onto a contacting surface by applying load and vibration to the component, said bonder comprising a bonding tool and a pressing mechanism for pressing said bonding tool onto the component, said bonding tool comprising:

a lateral horn supported by a fixing part;

a transducer arranged to apply vibration to said horn in a first direction which is a length direction of said horn;

a protrusion protruding from said horn in a second direction approximately perpendicular to said first direction; and a bonding portion provided on a tip of said protrusion and arranged to contact the component, wherein displacement at both side ends of said bonding portion along the second direction caused by bending generated on said protrusion by said vertical vibration cancels out displacement at said both side ends along the first direction of said bonding portion caused by expansion and compression vibration of said horn in the second direction induced by said vibration.

3. A component bonding tool for press-bonding a component onto a contacting face by applying load and vibration to the component, said bonding tool comprising:

a lateral horn supported by a fixing part;

a transducer arranged to apply vibration to said horn in the first direction which is a length direction of said horn;

a protrusion protruding from said horn in a second direction approximately perpendicular to said first direction; and a bonding portion provided on a tip of said protrusion and arranged to contact the component, wherein a phase of expansion and compression vibration waveform of said horn in the second direction, which is generated by said vibration, is set to the same phase as that of bending vibration waveform at said protrusion generated by said vibration.

4. A component bonding tool for press-bonding a component onto a contacting face by applying load and vibration to the component, said bonding tool comprising:

a lateral horn supported by a fixing part;

a transducer arranged to apply vibration to said horn in the first direction which is a length direction of said horn;

a protrusion protruding from said horn to a second direction approximately perpendicular to said first direction; and a bonding portion provided on a tip of said protrusion and arranged to contact the component, wherein displacement at both side ends of said bonding portion along the second direction caused by bending vibration generated on said protrusion by said vibration cancels out displacement at said both side ends along the first direction of said bonding portion caused by expansion and compression vibration of said horn in the second direction induced by said vibration.

* * * * *